United States Patent [19]
Nakaki et al.

[11] Patent Number: 5,998,816
[45] Date of Patent: Dec. 7, 1999

[54] SENSOR ELEMENT WITH REMOVAL RESISTANCE REGION

[75] Inventors: Yoshiyuki Nakaki; Tomohiro Ishikawa; Masashi Ueno; Hisatoshi Hata; Masafumi Kimata, all of Tokyo, Japan

[73] Assignee: Mitsubishi Denki Kabushiki Kaisha, Tokyo, Japan

[21] Appl. No.: 08/926,974

[22] Filed: Sep. 10, 1997

[30] Foreign Application Priority Data

Jan. 31, 1997 [JP] Japan ................................. 9-018591

[51] Int. Cl.⁶ ........................... H01L 27/20; H01L 29/84
[52] U.S. Cl. ..................... 257/254; 257/517; 257/518; 257/520; 73/514.16; 73/514.21; 73/514.22; 73/514.33; 73/514.34; 73/DIG. 1; 73/DIG. 4; 438/50; 438/52
[58] Field of Search ..................... 257/517, 518, 257/520, 254; 73/514.36, 514.33, 514.16, 514.34, 514.35, 514.38, 514.21, 514.22, 514.23, 777, DIG. 1, DIG. 4, 778; 438/50, 52

[56] References Cited

U.S. PATENT DOCUMENTS

| | | | |
|---|---|---|---|
| 5,316,979 | 5/1994 | Mac Donald et al. | 437/203 |
| 5,503,017 | 4/1996 | Mizukoshi | 73/514.36 |
| 5,576,250 | 11/1996 | Dien et al. | 437/228 |
| 5,659,138 | 8/1997 | Iwata et al. | 73/514.33 |
| 5,682,053 | 10/1997 | Wiszniewski | 257/401 |
| 5,698,112 | 12/1997 | Naeher et al. | 216/2 |
| 5,834,333 | 11/1998 | Seefeldt et al. | 438/52 |

FOREIGN PATENT DOCUMENTS

| | | |
|---|---|---|
| 0 375 205 | 6/1990 | European Pat. Off. . |
| WO 93/26051 | 12/1993 | WIPO . |
| WO 96/23229 | 8/1996 | WIPO . |

OTHER PUBLICATIONS

F. Chang, et al., "Gas–phase Silicon Micromachining with Xenon Difluoride", SPIE, vol. 2641, 1995, pp. 117–128.

*Primary Examiner*—William Mintel
*Attorney, Agent, or Firm*—Oblon, Spivak, McClelland, Maier & Neustadt, P.C.

[57] ABSTRACT

A sensor element provided with a silicon substrate having a semiconductor circuit, a sensing-element portion formed on the silicon substrate and connected to the semiconductor circuit, and a cavity portion formed by removing a silicon substrate portion below the sensing-element portion, in which a removal resistance region having resistance against substrate removal is provided in the silicon substrate between the semiconductor circuit and the cavity portion.

6 Claims, 7 Drawing Sheets

SENSOR ELEMENT WITH REMOVAL RESISTANCE REGION

BACKGROUND OF THE INVENTION

1. Field of the Invention

The present invention relates to a sensor element which is fabricated on a semiconductor circuit by using a micromachining technology, as well as a manufacturing method thereof.

FIGS. 7A and 7B are schematic diagrams of a conventional sensor element disclosed in, for example, WO93/26051. In FIG. 7A, reference numeral 1 denotes a substrate, and 2 denotes a substrate-removing hole. An unillustrated sensing-element portion serving as a sensor element is provided in a region surrounded by the substrate-removing holes 2 on the substrate 1. Because the sensor uses a temperature change, a crystalline anisotropic etching technology based on a wet process using a solution is used so as to remove a substrate portion in a range surrounded by the substrate-removing holes 2 to form a cavity portion in the substrate below the sensing-element portion, whereby the substrate 1 and the sensing-element portion are separated and thermally isolated to prevent the heat from escaping to the substrate 1. With this sensor, it is ensured that the square region surrounded by the substrate-removing holes 2 is oriented in the (110) direction in the crystalline orientation of the substrate. In the crystalline anisotropic etching technology, the amount of substrate removal with respect to the (111) plane is small. Consequently, if the substrate is removed on the basis of this phenomenon, a desired region of the substrate which is principally surrounded by four (111) planes including the (110) direction is removed. In this way, a substrate portion which is desired to be left can be defined by the substrate-removing holes, thereby making it possible to fabricate an integrated sensor element.

However, when the substrate is removed in the above-described wet process, the erosion of the substrate at the (111) planes which are desired to be left is not nil, so that a region of the substrate which is larger than the region surrounded by the substrate-removing holes is removed. Particularly, when an attempt is made to form a highly integrated element, a semiconductor circuit for processing a signal from the sensing-element portion should be provided in the substrate in the vicinity of the sensing-element portion. Hence, there has been a problem in that if the region of the substrate larger than the region surrounded by the substrate-removing holes is removed, the breakdown of the circuit occurs, and the element fails to function as the sensor.

In addition, in the wet process, when the sensor element is removed the solution and is dried, the sensing-element portion may adhere to the bottom of the removed substrate portion and breaks down. To overcome this problem, a substrate removing technology based on a dry processing using xenon difluoride gas or the like has been proposed, as disclosed in WO96/23229. In the dry process, the drying step which is essential to the wet process is not used, there is an advantage in that the breakdown of the sensor is nil. However, since substrate removal occurs isotropically from the substrate-removing holes without conforming to the crystalline orientation, a region of the substrate larger than in the wet process is removed. Accordingly, there has been a problem in that the high integration of the sensor element is made more difficult than the wet process.

SUMMARY OF THE INVENTION

The present invention has been devised to overcome the above-described problems, and its object is to provide a sensor element in which the substrate removal of only a desired region can be effected, and which can be highly integrated. In addition, another object of the present invention is to provide a sensor element in which a structural member such as a sensing-element portion does not adhere to the substrate. Still another object is to provide a method for manufacturing the above-described sensor element.

A sensor element according to the present invention is comprised of: a silicon substrate having a semiconductor circuit; a sensing-element portion formed on the silicon substrate and connected to the semiconductor circuit; a cavity portion formed by removing a silicon substrate portion below the sensing-element portion; and a removal resistance region having resistance against substrate removal provided in the silicon substrate between the semiconductor circuit and the cavity portion.

As described above, in accordance with the present invention, since a removal resistance region having resistance against substrate removal is provided in the silicon substrate between the semiconductor circuit and the cavity portion, an advantage is obtained in that it is possible to remove only the desired region of the substrate and highly integrate the sensor element.

A method for manufacturing a sensor element comprised of the steps of: forming a removal resistance region having resistance against substrate removal, the removal resistance region being formed between a semiconductor-circuit forming region and a sensing-element-portion forming region of a silicon substrate having the semiconductor-circuit forming region and the sensing-element-portion forming region; and forming a cavity portion by removing a substrate portion surrounded by the removal resistance region located below the sensing-element-portion forming region.

In addition, in accordance with the present invention, an advantage is obtained in that it is possible to remove only the desired region of the substrate and highly integrate the sensor element.

DETAILED DESCRIPTION OF THE INVENTION

Figure 1A:
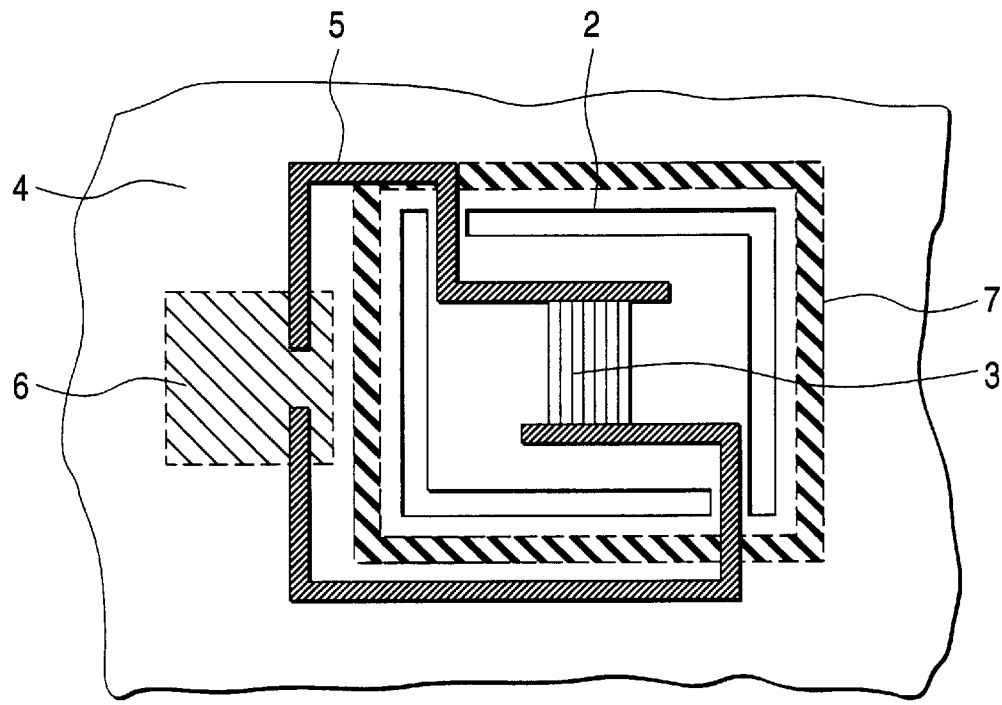
FIGS. 1A and 1B are a top view and a cross-sectional view illustrating a first embodiment of a sensor element in accordance with the present invention, respectively.

Description of the present invention will be described as follows.

A sensor element according to the present invention has a silicon substrate having a semiconductor circuit; a sensing-element portion formed on the silicon substrate, the sensing-element portion being connected to the semiconductor circuit; a cavity portion formed by removing a silicon substrate portion below the sensing-element portion; a removal resistance region having resistance against substrate removal, the removal resistance region being provided in the silicon substrate between the semiconductor circuit and the cavity portion.

The removal resistance region may be formed of at least one of silicon oxide, silicon nitride, photoresist, and aluminum. In addition, the removal resistance region may be formed of silicon oxide which is obtained by forming a groove in the silicon substrate and by subsequently thermally oxidating inner walls of the groove. Further, the depth of the removal resistance region is deeper than a half of the depth of substrate removal. Furthermore, the removal resistance region is formed to surround a periphery of a substrate portion located below the sensing-element portion.

A sensor element according to the present invention is manufactured by the steps of: forming a removal resistance region having resistance against substrate removal, the removal resistance region being formed between a semiconductor-circuit forming region and a sensing-element-portion forming region of a silicon substrate having the semiconductor-circuit forming region and the sensing-element-portion forming region; and forming a cavity portion by removing a substrate portion surrounded by the removal resistance region located below the sensing-element-portion forming region.

The substrate removal may be effected by using a fluoride of a rare gas or a fluoride of a haloid.

A sensor element according to the present invention is manufactured by the steps of forming a plurality of substrate-removing holes between a semiconductor-circuit forming region and a sensing-element-portion forming region of a silicon substrate having the semiconductor-circuit forming region and the sensing-element-portion forming region; forming a first removal resistance region in a vicinity of a bottom of the substrate-removing hole located in close proximity to the semiconductor-circuit forming region among the plurality of substrate-removing holes; and forming a cavity portion by removing a substrate portion extending from the substrate-removing hole to a substrate portion located below the sensing-element-portion forming region.

The first removal resistance region may have resistance against etching based on a wet process, but does not have resistance against etching based on a dry process. In addition, the first removal resistance region may be formed of at least one of boron-added silicon, titanium, and molybdenum. In addition, an interval between the semiconductor-circuit forming region and the substrate-removing hole located in close proximity to the semiconductor-circuit forming region may be greater than or equal to a half of a maximum width of the cavity portion. Further, the method for manufacturing a sensor element further comprises the step of: forming a second removal resistance region in the silicon substrate between the semiconductor-circuit forming region and the substrate-removing hole located in close proximity to the semiconductor-circuit forming region. Furthermore, the substrate removal is effected by etching based on a wet process using any one of an aqueous solution of potassium hydroxide, an aqueous solution of sodium hydroxide, an aqueous solution of tetramethylammonium hydroxide, and an aqueous solution of ethylenediamine pyrocaterol, and then by etching based on a dry process using a fluoride of a rare gas or a fluoride of a haloid. Moreover, xenon difluoride is preferably used in the present invention.

First Embodiment

Figure 1B:
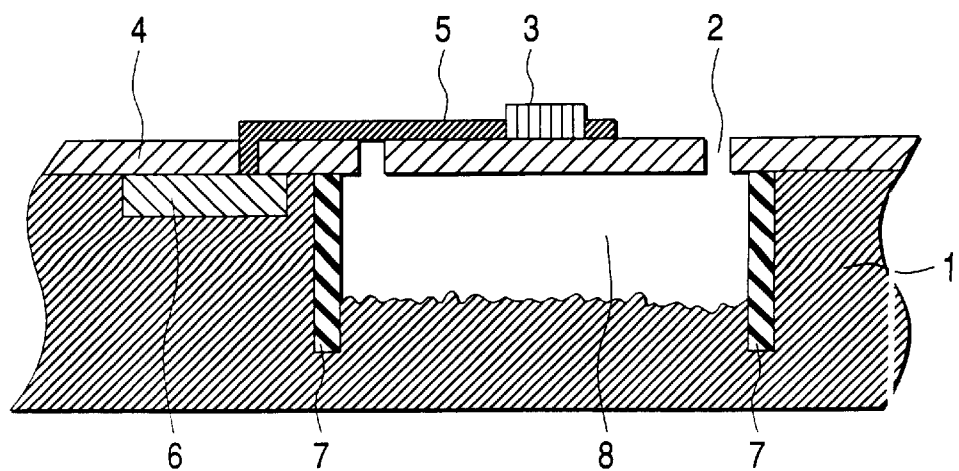

FIGS. 1A and 1B are a top view and a cross-sectional view illustrating a first embodiment of a sensor element in accordance with the present invention. In the drawings, reference numeral 1 denotes a substrate mainly formed of silicon; 2, a substrate-removing hole; 3, a sensing-element portion formed of polycrystalline silicon, titanium oxide and the like; 4, a supporting film for supporting the sensing-element portion 3; 5, a wiring for sending a signal from the sensing-element portion 3; 6, a semiconductor circuit for processing the signal from the sensing-element portion 3 and sending the processed signal to an external circuit (not shown); 7, a removal resistance region having resistance against an etchant for removing the substrate; and 8, a cavity portion which is left after removal of the substrate. Incidentally, although only one element is shown in the drawings, a plurality of these elements are actually provided in the form of an array. In addition, the sensing-element portion 3 used is a material whose physical property value changes due to a temperature change, and it is possible to use as other materials such as a theroelectromotive material and a pyroelectric material. In addition, the sensor element may be one in which the sensing-element portion is formed of a thin-film magnet, and the displacement of the sensing-element portion is detected by magnetic induction due to a peripheral circuit. In this case, the wiring 5 is unnecessary.

Figure 2A:
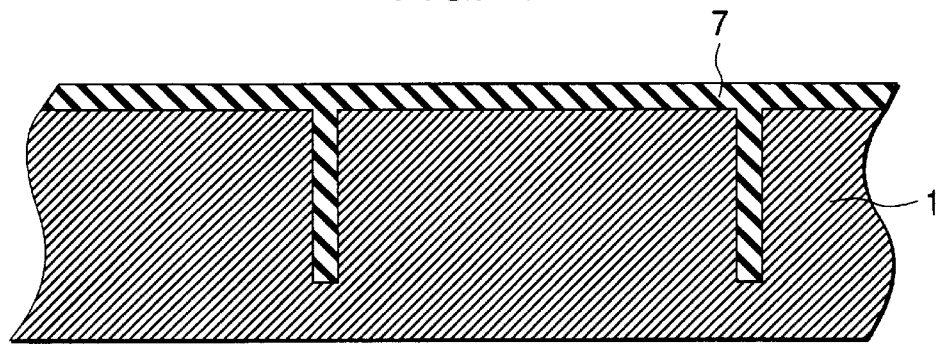
FIGS. 2A to 2C are diagrams illustrating a method of manufacturing the sensor element in accordance with the first embodiment of the present invention.
Figure 2B:
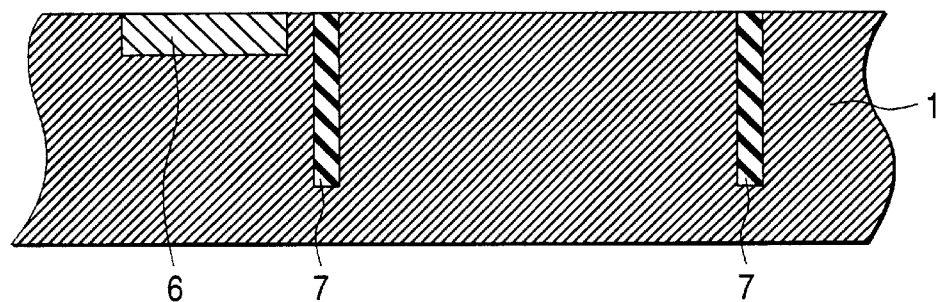
Figure 2C:
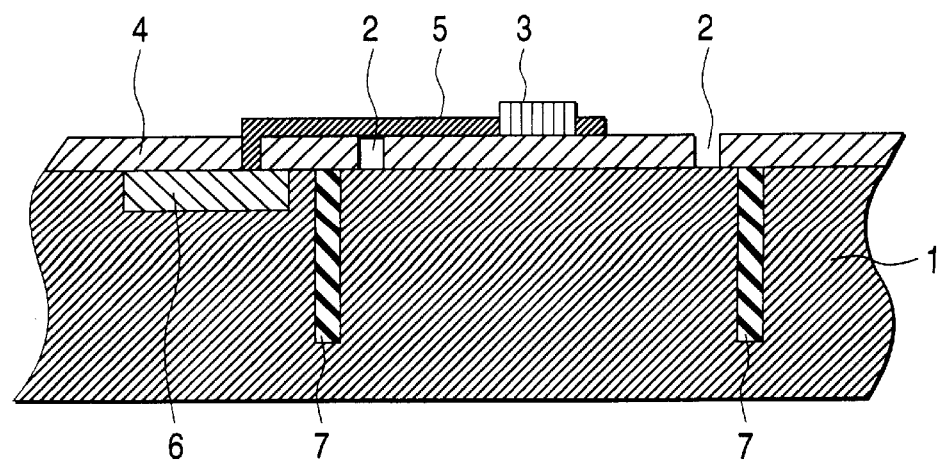

In addition, FIGS. 2A to 2C are diagrams illustrating a method of manufacturing the sensor element in accordance with the first example of the present invention. A description of an example of the manufacturing method will be given of the method of manufacturing the sensor element with reference to FIGS. 2A to 2C. First, after a groove is formed by highly anisotropic etching in a region of the substrate 1 which surrounded a portion subject to substrate removal, silicon oxide is embedded by a chemical vapor deposition process in the groove, thereby forming the removal resistance region 7 (FIG. 2A). This removal resistance region 7 is formed between a semiconductor-circuit forming region where the semiconductor circuit 6 is to be formed and a sensing-element-portion forming region where the sensing-element portion 3 was to be formed. It should be noted that the region where the semiconductor circuit 6 has already formed also be referred to as the semiconductor-circuit forming region. The same applies to the sensing-element-portion forming region as well. Next, after the silicon oxide on the substrate surface is removed, the semiconductor circuit 6 was formed (FIG. 2B). Subsequently, the supporting film 4, the sensing-element portion 3, the wiring 5, and the substrate-removing hole 2 is formed (FIG. 2C). After this sensor element is cut to a desired size, the sensor element is exposed to xenon difluoride gas having a pressure of 100 Pa to remove the substrate.

The sensor element was manufactured in accordance with the above. As a result, the substrate 1 surrounded by the removal resistance region 7 below the sensing-element portion 3 was completely removed, and the removal resistance region 7 was not processed, thereby making it possible to form only the desired region into a cavity structure.

Although, xenon difluoride is used for substrate removal in this embodiment, a similar effect can be obtained by using a fluoride of a rare gas such as krypton fluoride. In addition, although the removal resistance region 7 is formed of silicon oxide, it was confirmed that a similar effect can be obtained if silicon nitride or a composite film thereof was used. Further, the material of the removal resistance region 7 is confined to these materials insofar as the material has resistance against the xenon difluoride gas.

Second Embodiment

In a second example, the removal resistance region 7 is formed by a thermal oxidation process. After a groove is formed in the substrate 1 by anisotropic etching, a portion of the substrate 1 defined by inner surfaces of the groove is subjected to thermal oxidation, thereby forming a silicon oxide film. Further, polycrystalline silicon is embedded in this groove by the chemical vapor deposition process. Subsequently, the semiconductor circuit 6 and the sensing-element portion 3 are formed. This sensor element is subjected to substrate removal by a dry process using xenon difluoride gas in the same way as in the above-described first embodiment.

The sensor element was manufactured in accordance with the above method. As a result, the substrate below the sensing-element portion 3 was completely removed, and the removal resistance region 7 was not removed, thereby making it possible to form only the desired region into a cavity structure. Incidentally, the material which is embedded in the groove may not be polycrystalline silicon, and a material may not be embedded.

Third Embodiment

Figure 3:
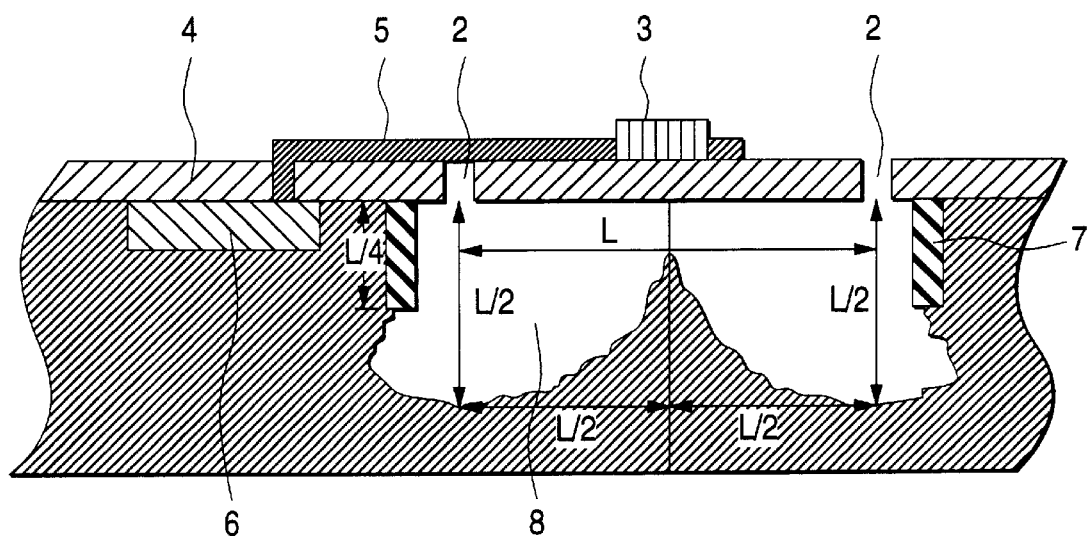
FIG. 3 is a cross-sectional view illustrating a third embodiment of the sensor element in accordance with the present invention.

FIG. 3 is a cross-sectional view illustrating a third embodiment of the sensor element in accordance with the present invention. In the drawing, L denotes a maximum width between the substrate-removing holes.

As shown in FIG. 3, when there are two substrate-removing holes 2, the etchant removes the substrate 1 isotropically at the same velocity in both the planar direction and the depthwise direction through the two substrate-removing holes 2, so that the amount of substrate removal is in the range surrounded by a depth L/2 and a width L/2. According to this embodiment, it is assumed that a maximum depth of the removal resistance region 7 is L/2, elements having depths of L/3, L/4, and L/5 are respectively fabricated, and these elements were subjected to substrate removal by the dry process using the xenon difluoride gas in the same way as in the above-described first embodiment.

The elements were manufactured in accordance with the above methods. As a result, in the element whose depth of the removal resistance region was L/4, the cavity portion extends over to the other side of the removal resistance region 7 and, in the element having a depth of L/5, the substrate portion in the vicinity of the semiconductor circuit 6 located in proximity to the sensing-element portion 3 is also removed, so that these elements are unable to operate as the sensor element. Accordingly, it can be said that it is sufficient to set the depth of the removal resistance region 7 to a dimension greater than a half of the depth of substrate removal, i.e., in this case, to a dimension greater than L/4.

Fourth Embodiment

As for the formation of the semiconductor circuit 6 and the formation of the removal resistance region 7, either one of them may be effected first. Although, in the above-described first to third embodiments, the semiconductor circuit 6 is provided after the formation of the removal resistance region 7. In this embodiment, the removal resistance region 7 is formed between the region for formation of the semiconductor circuit 6 and the region for formation of the sensing-element portion 3 after the provision of the semiconductor circuit 6. After the semiconductor circuit 6 is first formed, the insulating film which is formed at the time of fabrication of the semiconductor circuit 6 in the region for formation of the sensing-element portion 3 is removed. Next, a groove is formed in such a manner as to surround the sensing-element portion 3, and the removal resistance material is embedded in this groove, thereby forming the removal resistance region 7. As the materials of the removal resistance region 7, aluminum and a resist used in a photolithographic technology are respectively used. After the element is fabricated as described above, this sensor element was cut, and is subjected to substrate removal by the dry process using the xenon difluoride gas.

The element was manufactured in accordance with the above method. As a result, the substrate 1 below the sensing-element portion 3 was completely removed, and it was possible to obtain a desired structure.

It should be noted that although, in the first to fourth embodiments, the removal resistance region 7 is formed in such a manner as to surround the sensing-element portion, the removal resistance region 7 may not necessarily be formed in such a manner as to surround the sensing-element portion. Even if the removal resistance region 7 is not provided on the side where the region for formation of the semiconductor circuit 6 is not provided, no effect on the operation of the sensor element is observed.

Fifth Embodiment

Figure 4A:
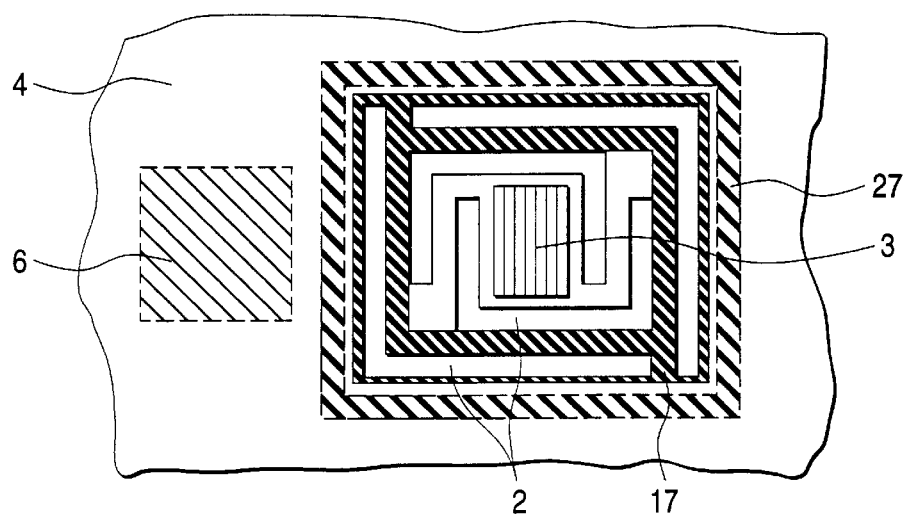
FIGS. 4A to 4C are a top view and cross-sectional views illustrating a fifth embodiment of the sensor element in accordance with the present invention, respectively.
Figure 4B:
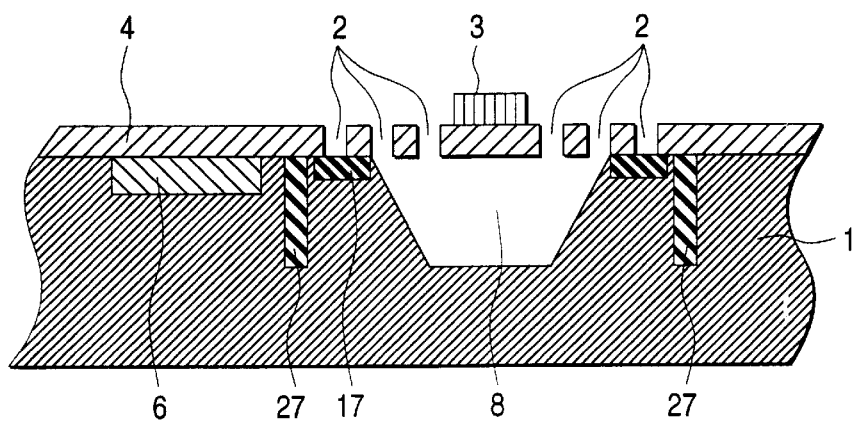
Figure 4C:
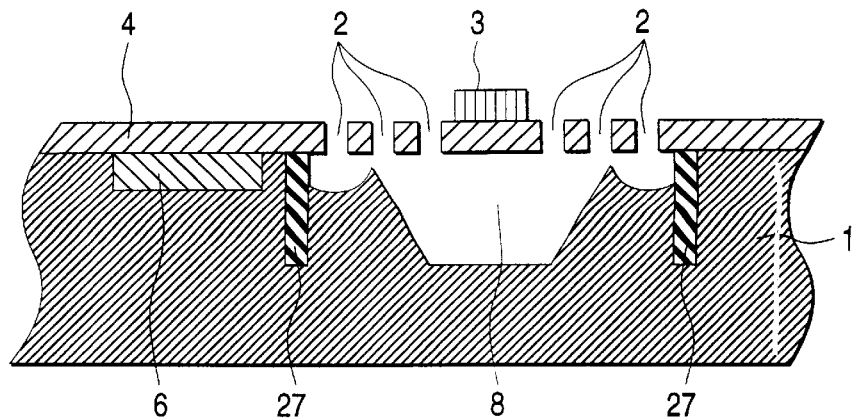

FIGS. 4A to 4C are a top view and cross-sectional views illustrating a fifth example of the sensor element in accordance with the present invention. In the drawings, reference numeral 17 denotes a first removal resistance region which is formed at least in the vicinity of a bottom of the substrate-removing hole 2 located in close proximity to the region for formation of the semiconductor circuit 6 among the plurality of substrate-removing holes 2; and 27 denotes a second removal resistance region which is formed in the substrate 1 between the region for formation of the semiconductor circuit 6 and the substrate-removing hole 2 located in close proximity to the region for formation of the semiconductor circuit 6, and these removal resistance regions are similar to the removal resistance region 7 in the above-described first to fourth embodiments.

The second removal resistance region 27 is formed by embedding silicon oxide after forming a groove in the substrate. The first removal resistance region 17 is boron-added silicon which has resistance against substrate removal in a wet process, but does not have resistance against the dry process using a fluoride of a rare gas. Subsequently, the semiconductor circuit 6, the sensing-element portion, and the like are formed. Incidentally, the first removal resistance region 17 and the second removal resistance region 27 may be formed after forming the semiconductor circuit 6 in the same way as the above-described fourth example.

After the fabrication of this element, the element is immersed in an aqueous solution of silicon-added tetramethylammonium hydroxide to effect substrate removal using a wet process. As shown in FIG. 4B, although the substrate is removed through the substrate-removing holes 2 by the aforementioned aqueous solution, the first removal resistance region 17 has resistance against the aqueous solution, so that only the region of the substrate surrounded by the substrate-removing hole 2 located in close proximity to the sensing-element portion is removed. It was described that if the wet process is used, the sensing-element portion undesirably adheres to the bottom of the removed substrate portion in a subsequent drying step. However, since the region which is removed by the wet process is a small range surrounded by the substrate-removing hole 2 located in close proximity to the sensing-element portion, so that the adherence can be prevented.

Subsequently, substrate removal is effected by a dry process using a fluoride of a rare gas, but since the removal resistance region 17 does not have resistance against the fluoride of the rare gas, as shown in FIG. 4C, the removal resistance region 17 and the substrate portion up to the second removal resistance region 27 are removed through the substrate-removing hole 2 located in close proximity to the semiconductor circuit 6.

As described above, by adopting a two-stage removing method in which the substrate is first removed in advance by the wet process, and the portion of the substrate located in close proximity to the second removal resistance region 27 is then removed shallowly by the dry process, even if the wet process is used jointly, it is possible to prevent the adhesion of the sensing-element portion to the bottom of the cavity portion 8 in the substrate 1. In addition, it is possible to obtain an advantage in that even if the second removal resistance region 27 is formed shallowly, the removed portion does not extend over to the other side of the second removal resistance region 27. The above-described method is very useful in the light of the fact that it is, in general, very difficult to form the second removal resistance region 27 deeply.

It should be noted that, as etchants for the wet process, the following aqueous solutions can used on a trial basis: an aqueous solution of potassium hydroxide, an aqueous solution of sodium hydroxide, an aqueous solution of tetramethylammonium hydroxide, and an aqueous solution of ethylenediamine pyrocaterol. In these cases as well, it is possible to obtain similar structures.

Figure 5A:
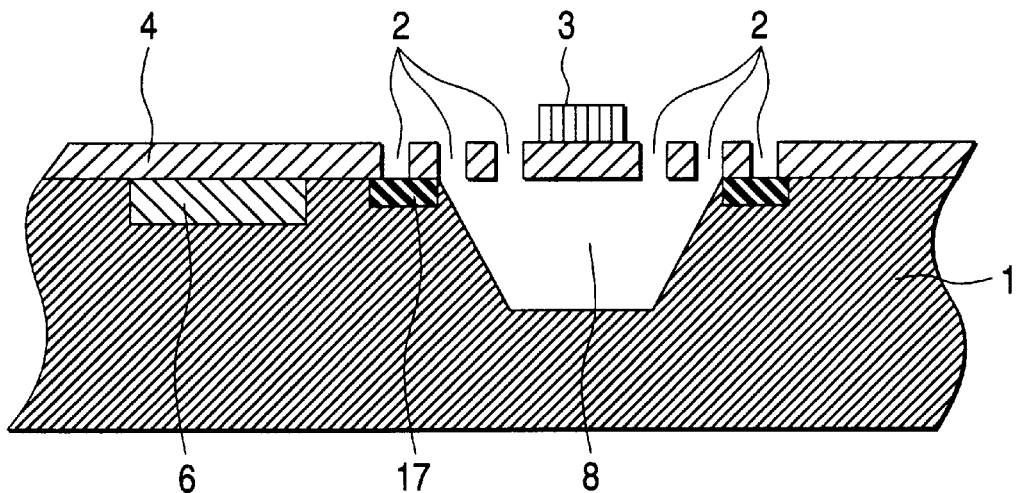
FIGS. 5A and 5B are cross-sectional views illustrating the fifth embodiment of the sensor element in accordance with the present invention.
Figure 5B:
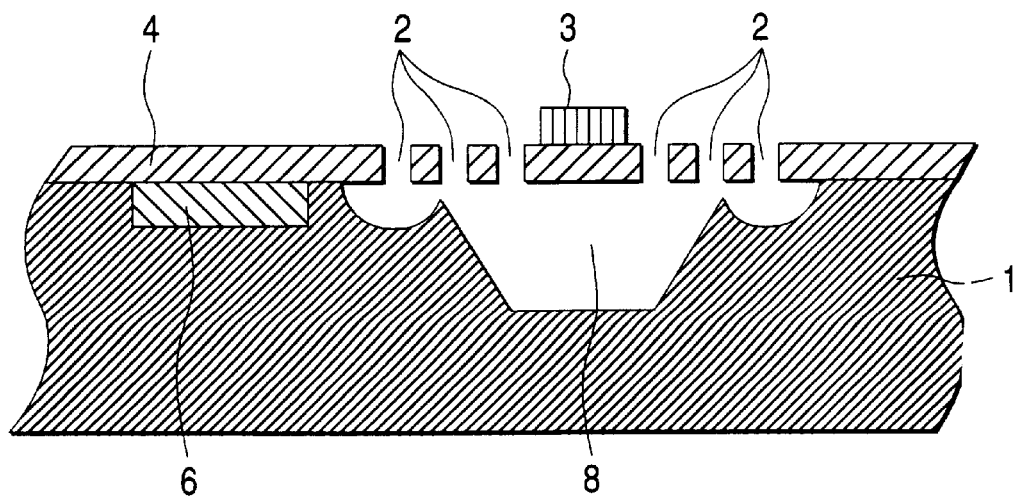

In addition, it is possible to obtain a desired structure even if the second removal resistance region 27 is not provided, and only the first second removal resistance region 17 is used, as shown in FIGS. 5A and 5B. Since the formation of the second removal resistance region 27 is difficult, if only the first removal resistance region 17 is used, as shown in FIGS. 5A and 5B, there is an advantage in that the fabrication of the element can be facilitated. In this case, however, conditions which are described in a seventh embodiment below are required.

Figure 6A:
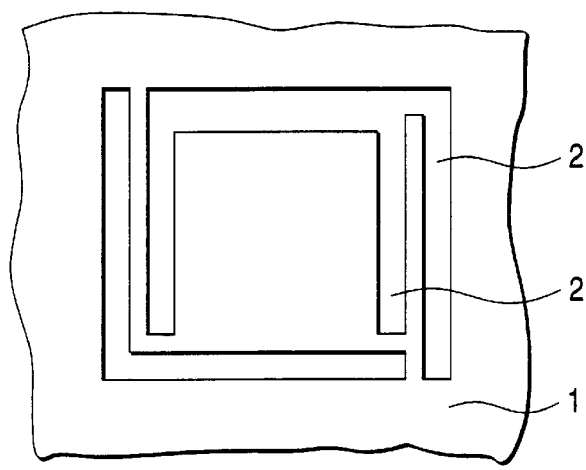
FIGS. 6A to 6C are top views illustrating the fifth embodiment of the sensor element in accordance with the present invention.
Figure 6B:
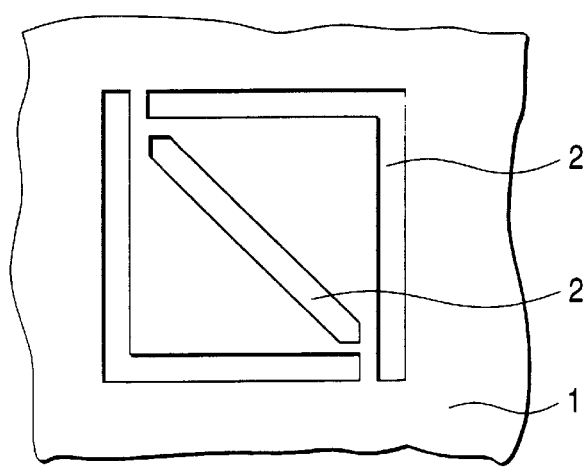
Figure 6C:
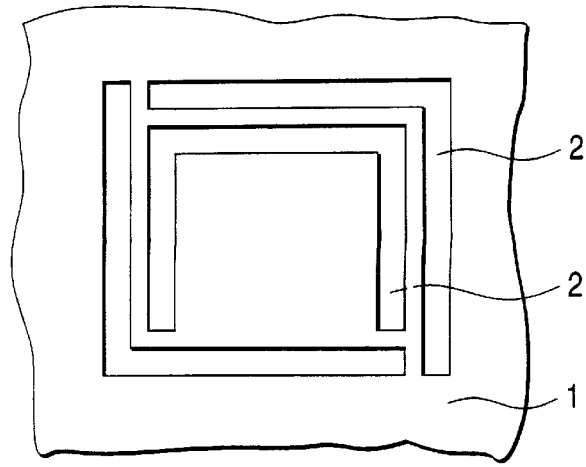
Figure 7A:
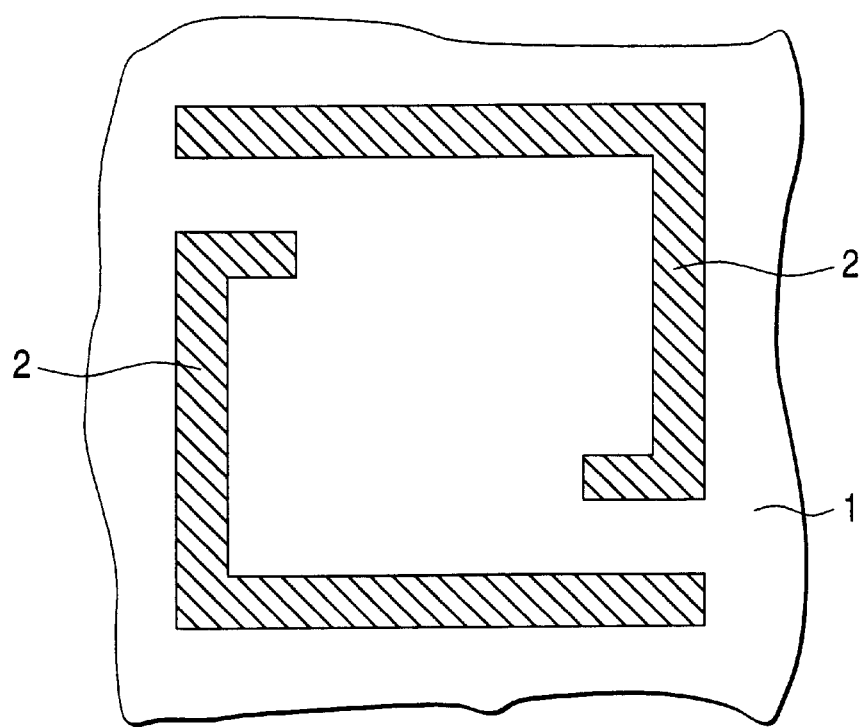
FIGS. 7A and 7B are top views of a conventional sensor element.
Figure 7B:
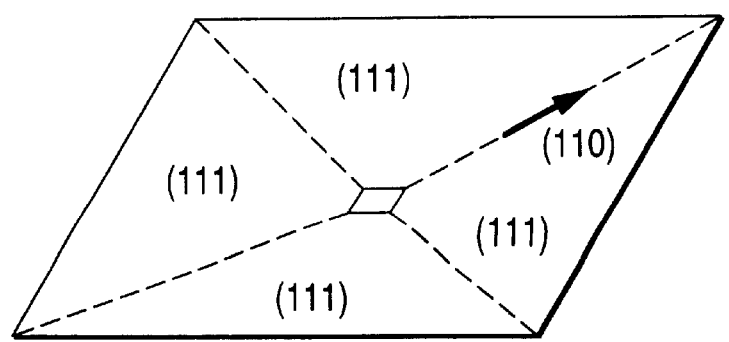

Furthermore, the plurality of substrate-removing holes 2 may not necessarily be separated. FIG. 6A shows an example of the element having a structure in which the plurality of substrate-removing holes 2 are partially connected. Further, as shown in FIG. 6B, one of the substrate-removing holes 2 may be formed on a diagonal line. Still further, an arrangement such as the one shown in FIG. 6C is also conceivable.

Sixth Embodiment

In a sixth embodiment, metallic films of titanium, molybdenum, gold, and platinum are used for the first removal resistance region 17 in the method of manufacturing the sensor element in accordance with the above-described fifth embodiment. Each metallic film is satisfactory in terms of the removal resistance characteristic with respect to the wet process. Nevertheless, the first removal resistance regions 17 using titanium and molybdenum are removed by the dry process, and it is possible to obtain desired cavity portions; however, the first removal resistance regions 17 using gold and platinum are not removed by the dry process, and it is not possible to obtain desired cavity portions. Therefore, it is found that the materials usable for the first removal resistance region 17 are titanium and molybdenum.

Seventh Embodiment

Since the sensor element shown in FIG. 6 is not provided with the second removal resistance region 27, it is necessary to provide a certain distance between the semiconductor circuit 6 and the substrate-removing hole 2 located in close proximity to the semiconductor circuit 6. Accordingly, elements in which, assuming that a maximum width between the substrate-removing holes 2 was L, the semiconductor circuit 6 was provided at distances of 0.4L, 0.5L, 0.6L, and 0.75L from an outermost peripheral position of the substrate-removing hole 2 located in close proximity to the semiconductor circuit 6 were respectively fabricated, and were processed in the same method as the above-described fifth embodiment. As a result, the semiconductor circuits 6 which were provided at distances of 0.5L and greater were operable. The reason for this is that, as described in detail in the above-described third embodiment, since 0.5L (L/2) is a depth which allows substrate removal, if the distance is smaller than 0.5L, the semiconductor circuit 6 is also eroded.

What is claimed is:

1. A sensor element comprising:
   a silicon substrate having a semiconductor circuit;
   a sensing-element portion formed on the silicon substrate and being ohmically connected to the semiconductor circuit;
   a cavity portion formed by removing a silicon substrate portion below the sensing-element portion; and
   a removal resistance region having resistance against substrate removal provided in the silicon substrate between the semiconductor circuit and the cavity portion.

2. A sensor element according to claim 1, wherein the removal resistance region is formed of at least one of silicon oxide, silicon nitride, photoresist, and aluminum.

3. A sensor element according to claim 1, wherein the removal resistance region is formed of silicon oxide which is obtained by forming a groove in the silicon substrate and by subsequently thermally oxidating inner walls of the groove.

4. A sensor element according to claim 1, wherein the depth of the removal resistance region is deeper than a half of the depth of substrate removal.

5. A sensor element according to claim 1, wherein the removal resistance region is formed in such a manner as to surround a periphery of a substrate portion located below the sensing-element portion.

6. A sensor element according to claim 1, wherein said sensing-element portion comprises at least one of a thermosensitive material, a thermoelectromotive material and a pyroelectric material.

* * * * *